United States Patent
Ueda

(10) Patent No.: US 12,289,918 B2
(45) Date of Patent: Apr. 29, 2025

(54) SEMICONDUCTOR DEVICE HAVING INTEGRATED TURN-ON AND TURN-OFF RESISTORS AND DIODE

(71) Applicant: RENESAS ELECTRONICS CORPORATION, Tokyo (JP)

(72) Inventor: Takehiro Ueda, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 167 days.

(21) Appl. No.: 17/463,150

(22) Filed: Aug. 31, 2021

(65) Prior Publication Data

US 2023/0062583 A1 Mar. 2, 2023

(51) Int. Cl.
| | |
|---|---|
| H10D 84/00 | (2025.01) |
| H01L 23/522 | (2006.01) |
| H10D 89/10 | (2025.01) |
| H10D 30/01 | (2025.01) |
| H10D 64/01 | (2025.01) |

(52) U.S. Cl.
CPC ....... *H10D 84/143* (2025.01); *H01L 23/5228* (2013.01); *H10D 89/10* (2025.01); *H10D 30/0291* (2025.01); *H10D 64/01* (2025.01)

(58) Field of Classification Search
CPC .......... H01L 23/5228; H01L 29/66712; H01L 29/0696; H01L 29/1095; H01L 29/41766; H01L 29/66734; H01L 29/781
See application file for complete search history.

(56) References Cited

U.S. PATENT DOCUMENTS

| | | | |
|---|---|---|---|
| 10,243,445 B2 | 3/2019 | Yamada | |
| 2006/0160310 A1* | 7/2006 | Miyata | H01L 29/7813 |
| | | | 257/E29.066 |
| 2018/0182750 A1* | 6/2018 | Burke | H01L 23/5226 |
| 2023/0026868 A1* | 1/2023 | Ji | H01L 29/7804 |

FOREIGN PATENT DOCUMENTS

JP 2018-182927 A 11/2018

* cited by examiner

*Primary Examiner* — Tucker J Wright
(74) *Attorney, Agent, or Firm* — Rimon P.C.

(57) ABSTRACT

The present invention suppresses an increase in manufacturing cost and reduces switching noise. A field-effect transistor having a gate electrode embedded in a trench in an upper surface of a semiconductor substrate, a source region formed in the semiconductor substrate, and a drain region formed on a lower surface of the semiconductor substrate is provided with a gate wiring formed on the semiconductor substrate and being electrically connected to the gate electrode, a gate pad formed on the semiconductor substrate, a first resistor connected between the gate pad and the gate wiring and being configured to function when the field-effect transistor is turned ON, a second resistor connected between the gate pad and the gate wiring and being configured to function when the field-effect transistor is turned OFF, and a rectifier diode included in the first resistor or the second resistor between the gate pad and the gate wiring.

6 Claims, 14 Drawing Sheets

SEMICONDUCTOR DEVICE HAVING INTEGRATED TURN-ON AND TURN-OFF RESISTORS AND DIODE

BACKGROUND

Figure 1:
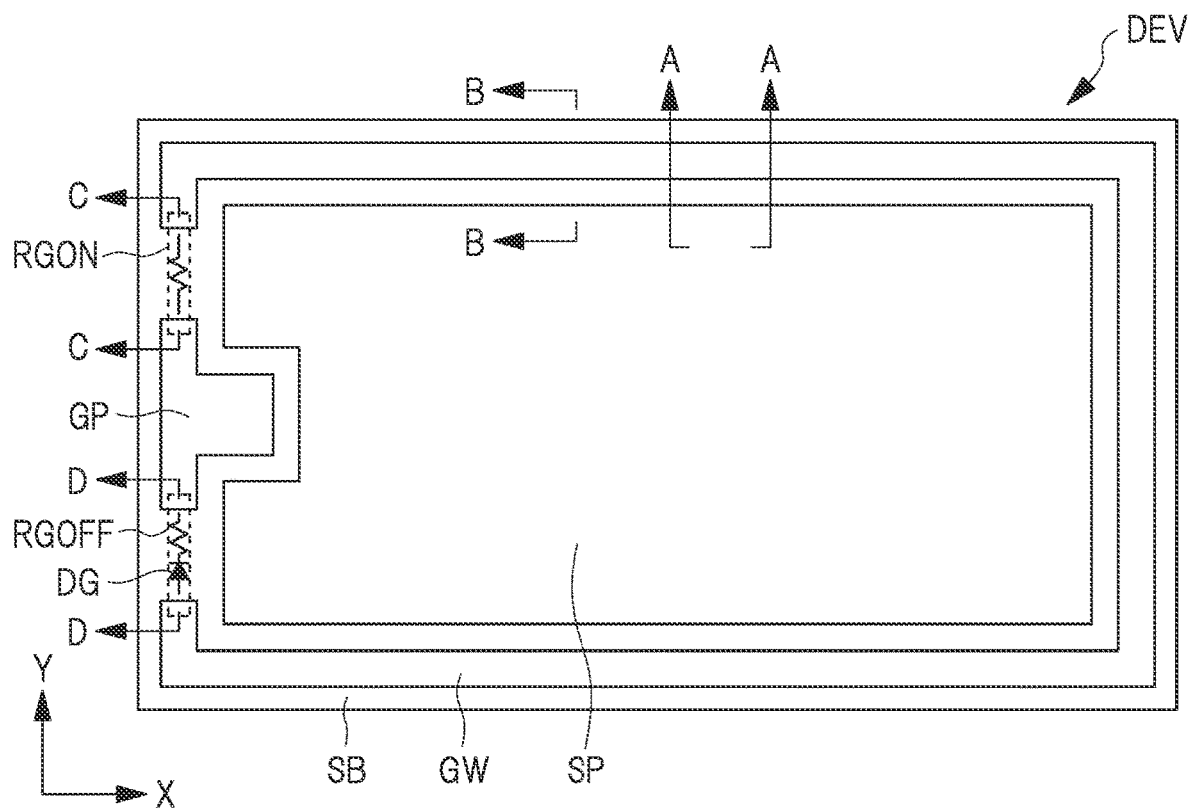

The present invention relates to a semiconductor device and a manufacturing method of the same, and more particularly relates to a technique effective when applied to a power semiconductor device.

There are disclosed techniques listed below.
[Patent Document 1] Japanese Unexamined Patent Application Publication No. 2018-182927

SUMMARY

Patent Document 1 discloses a method for controlling a slope at the time of switching (switching speed) in order to reduce noise of a power device (semiconductor device). A known structure for controlling the switching speed is configured such that a first resistor is connected to a gate electrode of a MOSFET constituting a semiconductor device, and a second resistor including a rectifier diode is connected in parallel to the first resistor. Here, the first resistor has a larger resistance value than the second resistor, and an anode of the diode is connected to the gate electrode of the MOSFET. Such a structure allows a gate resistor to be changed between an ON state and an OFF state of the MOSFET and makes it possible to control the switching speed of the semiconductor device.

In a case where the above-described first resistor, second resistor and diode are provided in order to control the switching speed of the semiconductor device, a configuration in which these elements are provided on a substrate outside the semiconductor device can be considered. However, this would pose a problem in which a mounting area and manufacturing cost of the device would increase. On the other hand, a configuration in which the first resistor, the second resistor and the diode are formed on the semiconductor substrate constituting the semiconductor device can be considered. However, if, for example, the diode is formed by stacking an N type semiconductor layer and a P type semiconductor layer on the semiconductor substrate, the semiconductor device would increase in size, and the manufacturing cost of the semiconductor device would also increase. In addition, if, for example, the diode is formed by forming an N type semiconductor layer on the semiconductor substrate and selectively forming a P type semiconductor region on an upper surface of the N type semiconductor layer by using a mask, the manufacturing cost of the semiconductor device would increase.

Other objects and novel characteristics will be apparent from the description of the present specification and accompanying drawings.

The following is a brief overview of a representative embodiment among the embodiments disclosed in the present application.

A semiconductor device according to one embodiment has a field-effect transistor comprising a gate electrode embedded in a trench in an upper surface of the semiconductor substrate, a source region formed in the semiconductor substrate, and a drain region formed on a lower surface of the semiconductor substrate, in which there are formed a gate wiring formed on the semiconductor substrate and being electrically connected to the gate electrode, a gate pad formed on the semiconductor substrate, a first resistor connected between the gate pad and the gate wiring and being configured to function when the field-effect transistor is turned ON, a second resistor connected between the gate pad and the gate wiring and being configured to function when the field-effect transistor is turned OFF, and a rectifier diode included in the first resistor or the second resistor between the gate pad and the gate wiring.

BRIEF DESCRIPTIONS OF THE DRAWINGS

Figure 2:
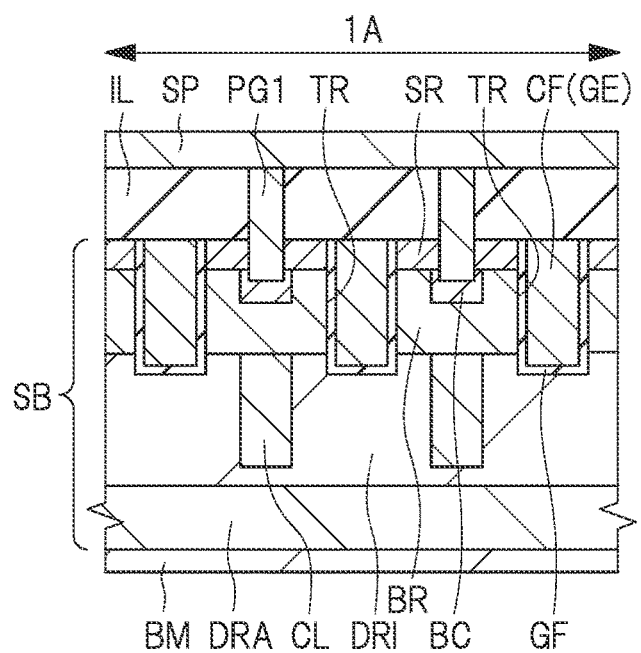
Figure 3:
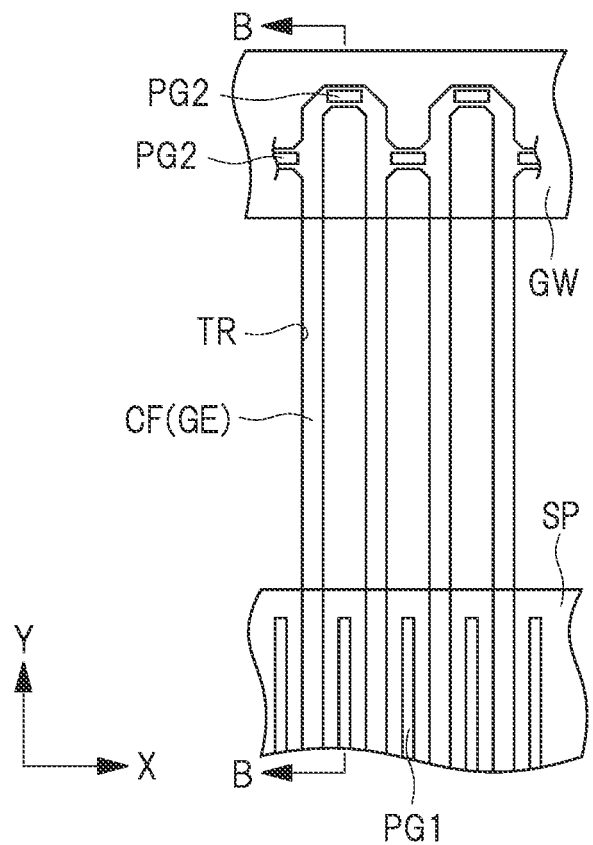
Figure 4:
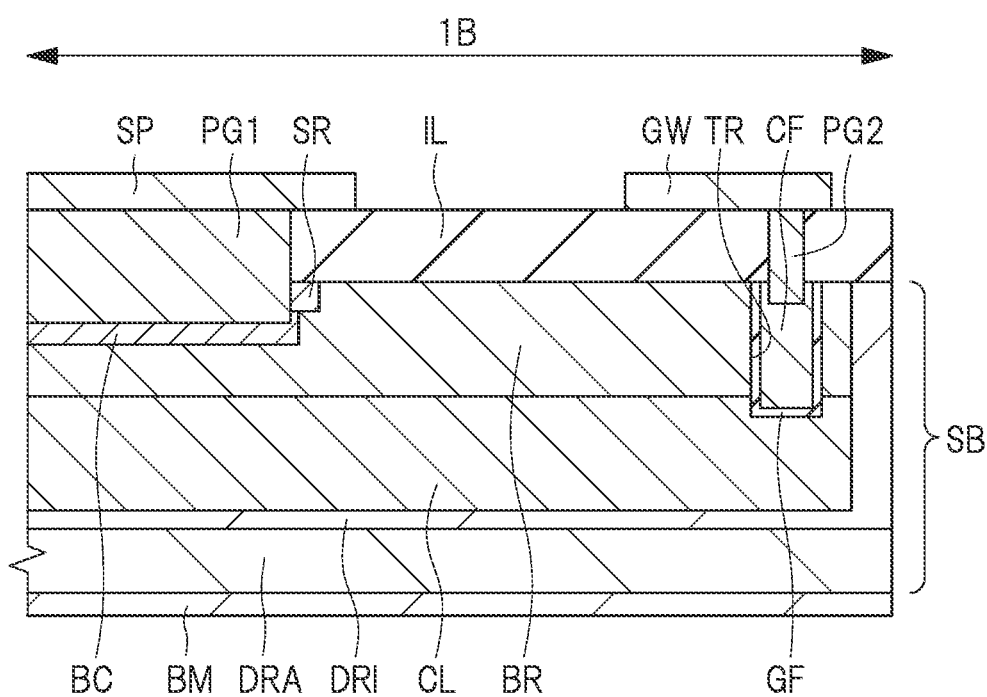
Figure 5:
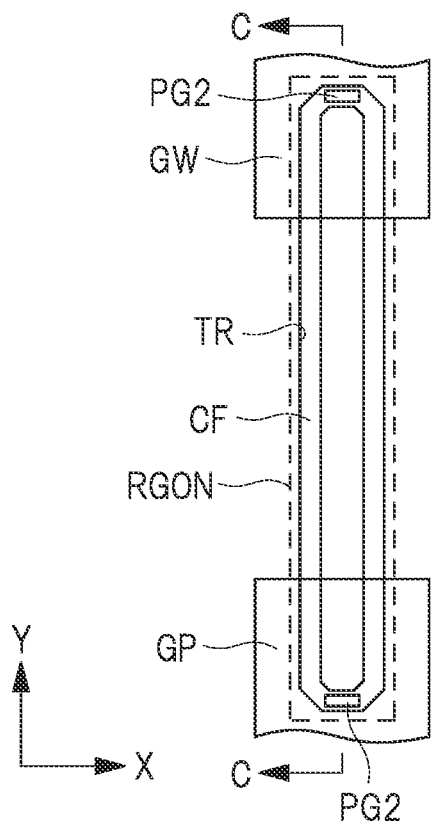
Figure 6:
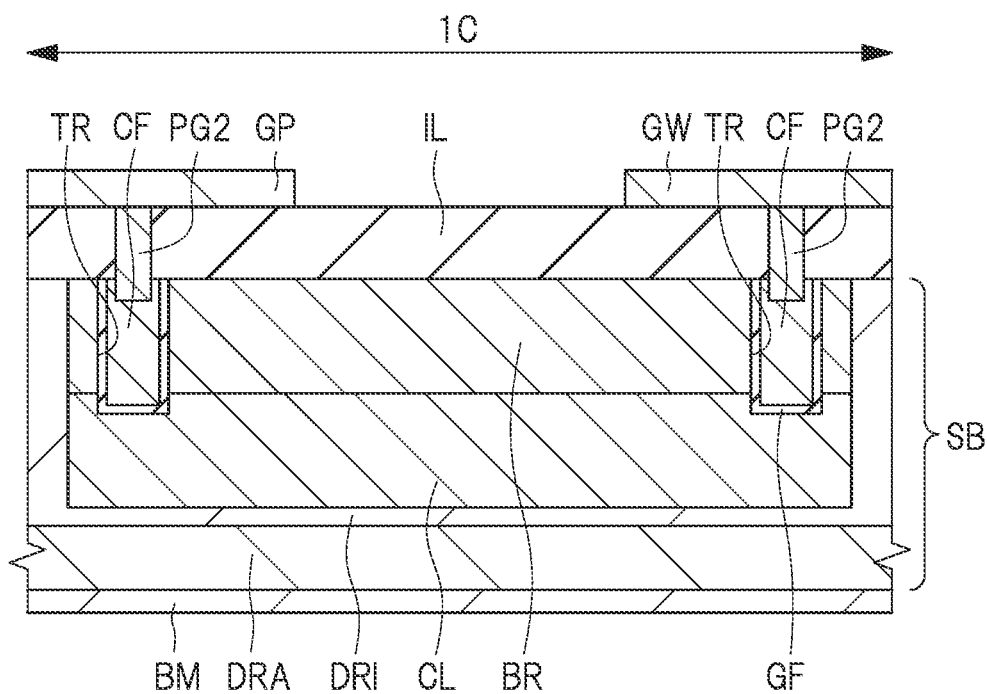
Figure 7:
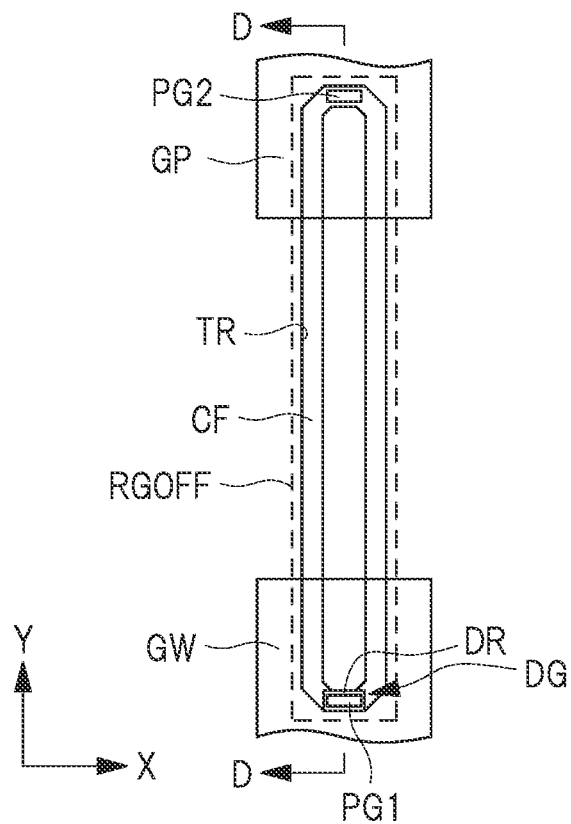
Figure 8:
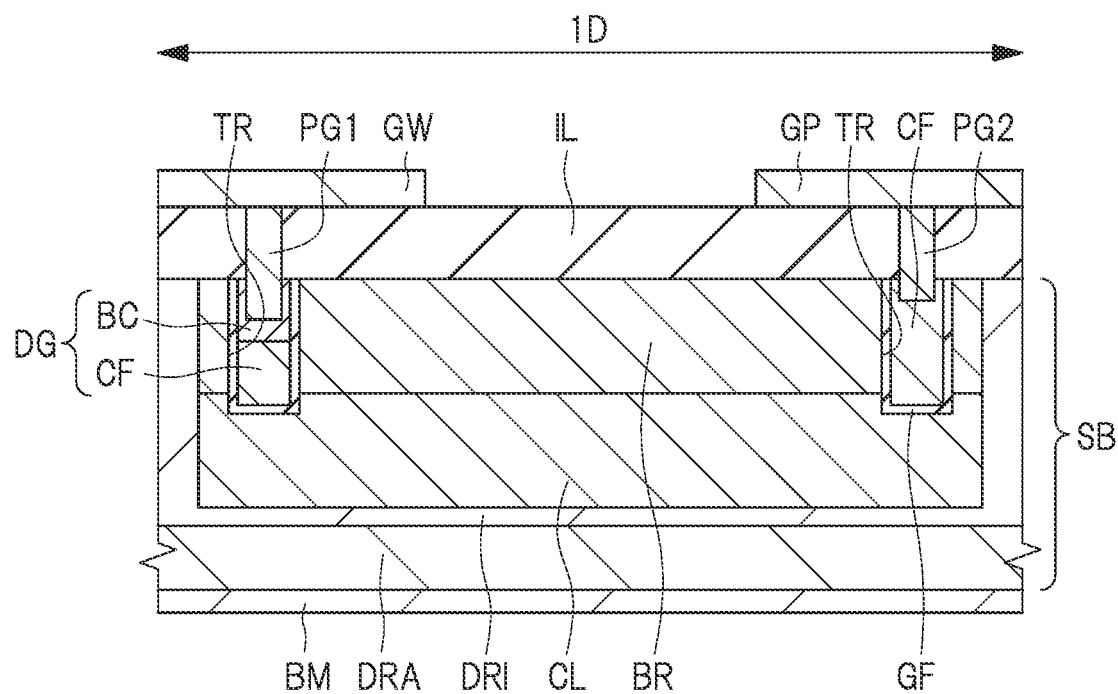
Figure 9:
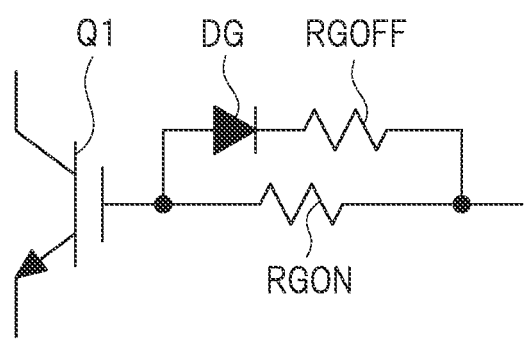
Figure 10:
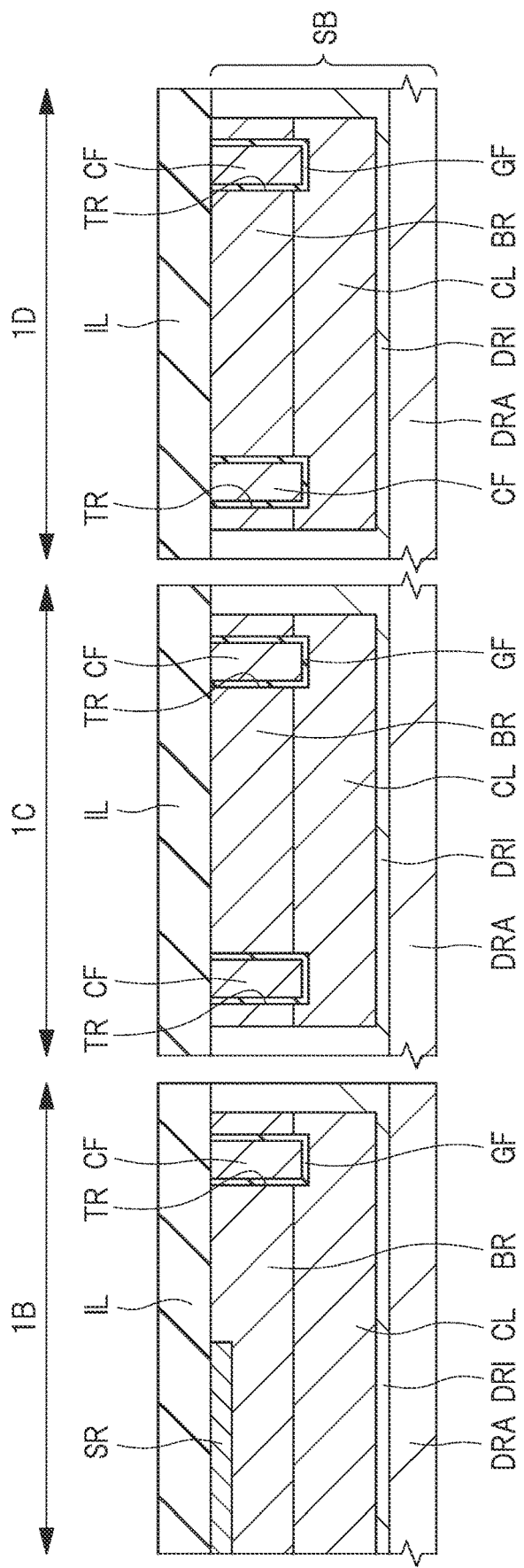
Figure 11:
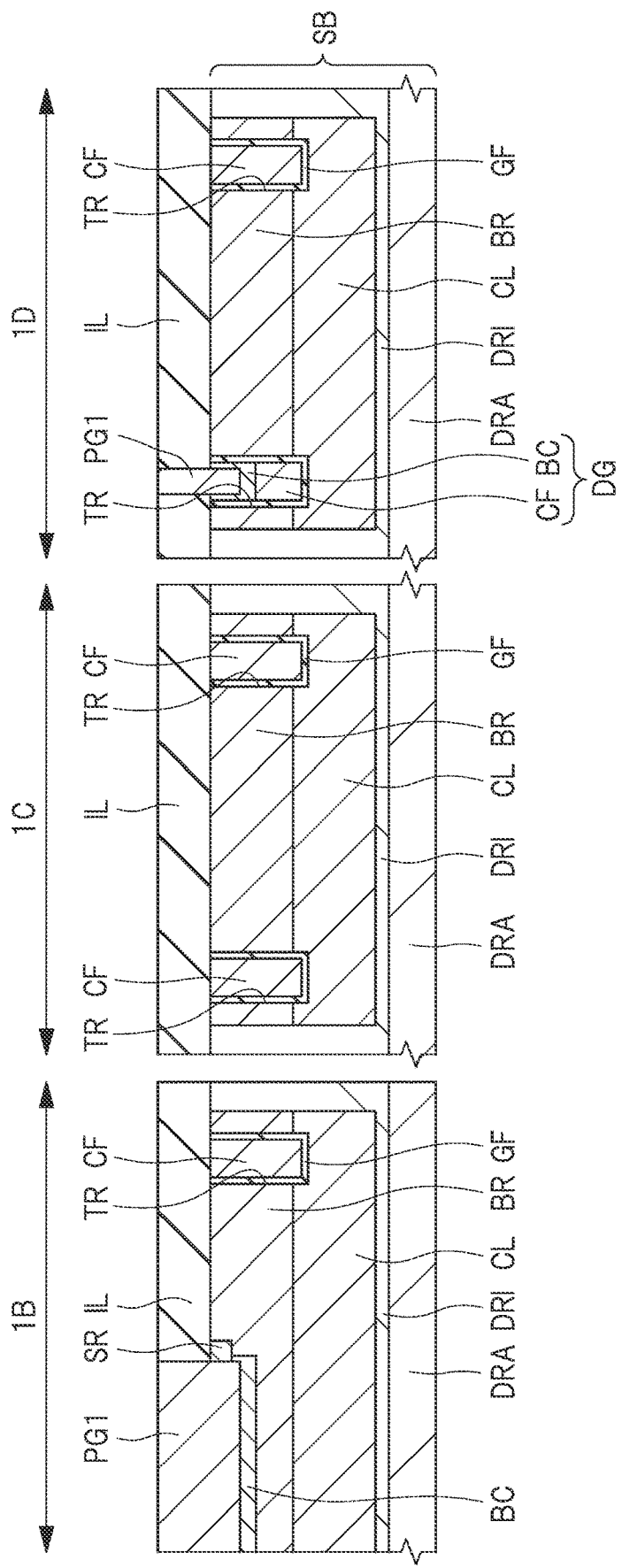
Figure 12:
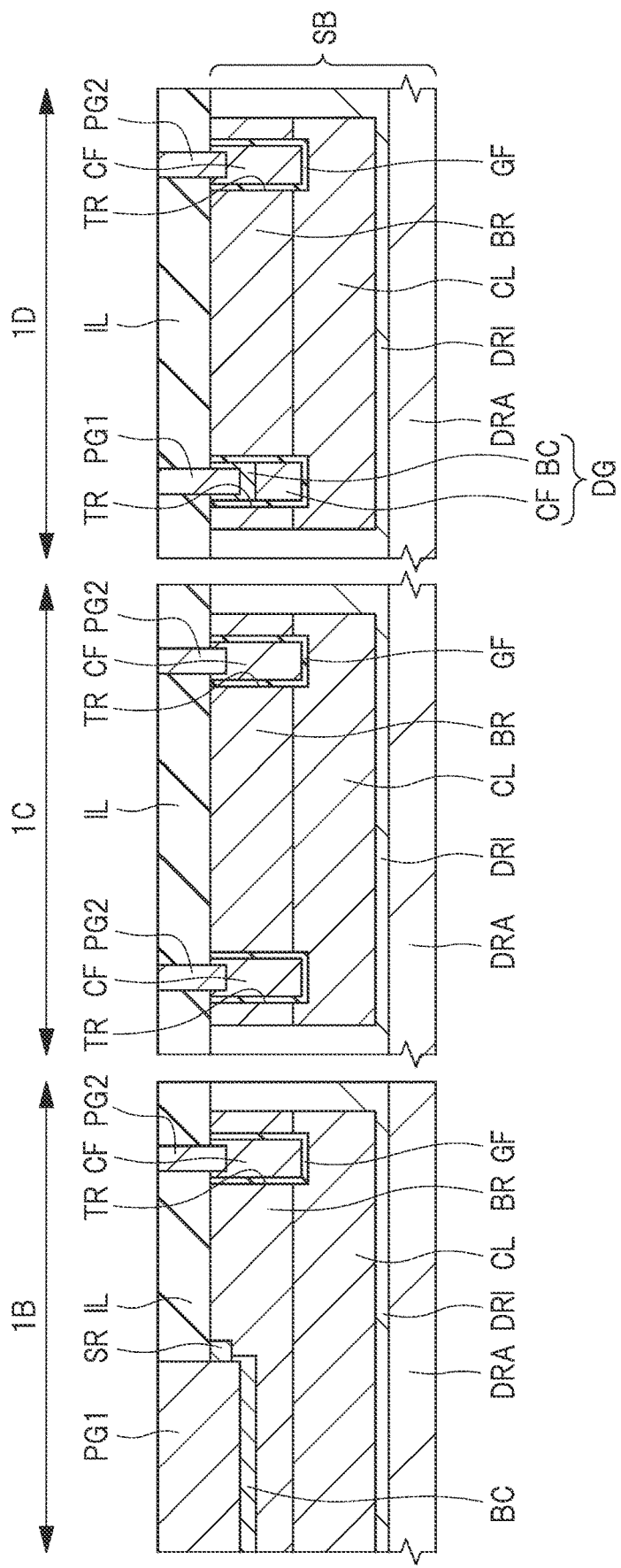
Figure 13:
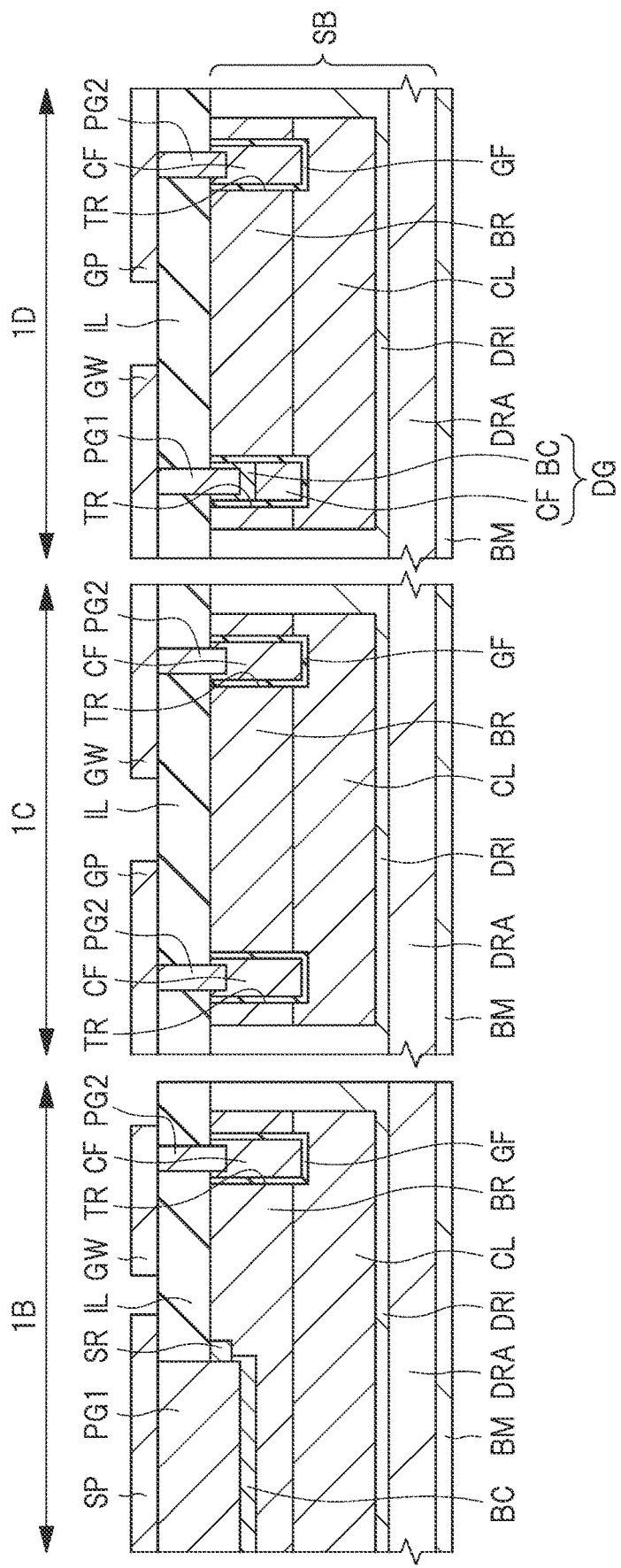
Figure 14:
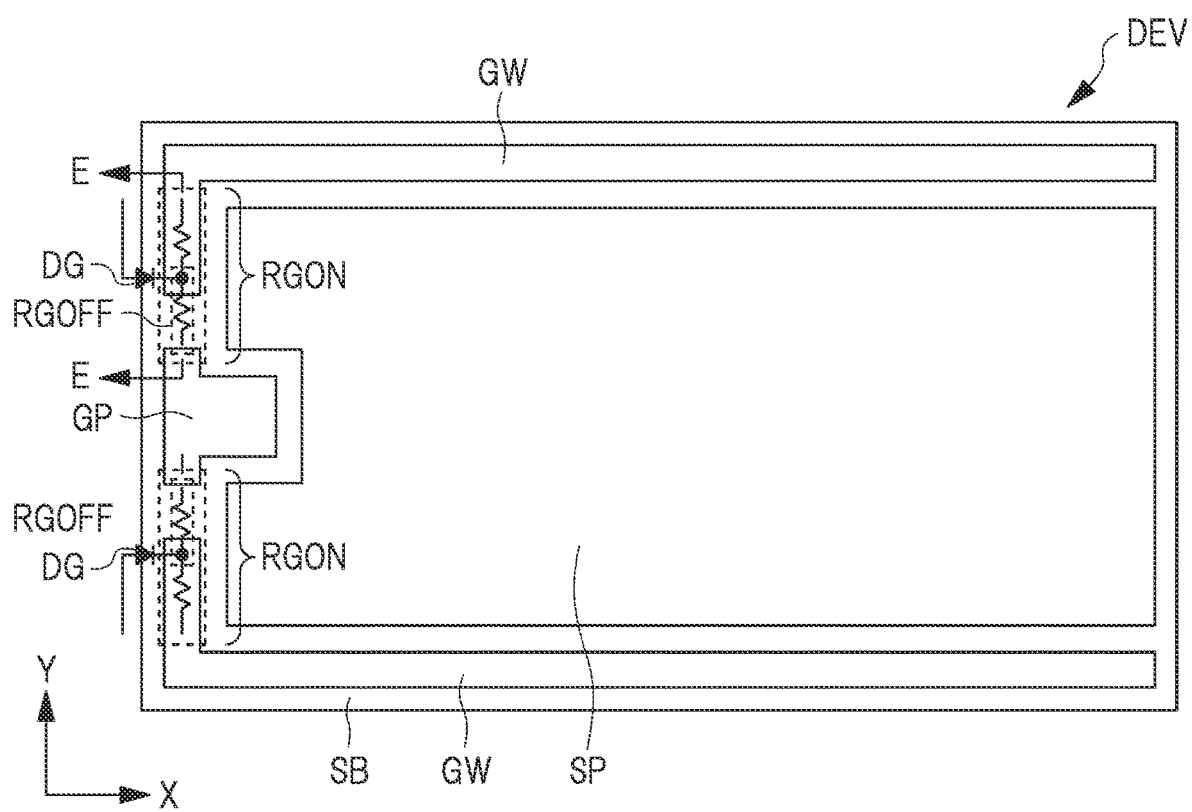
Figure 15:
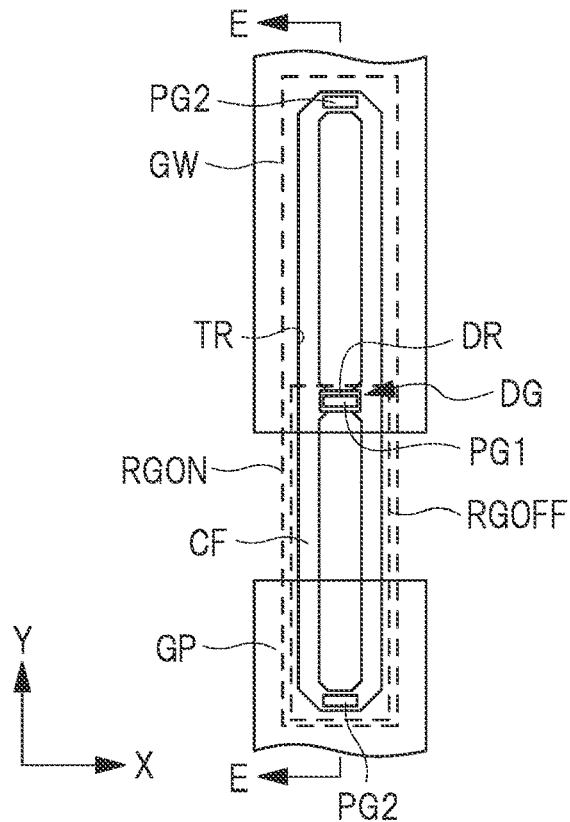
Figure 16:
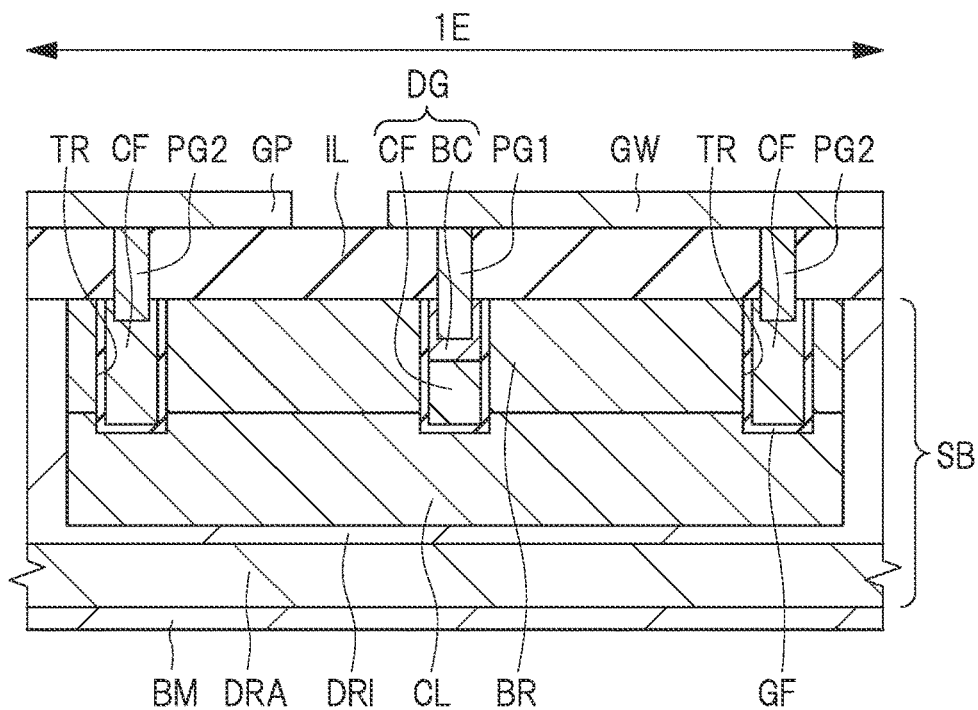
Figure 17:
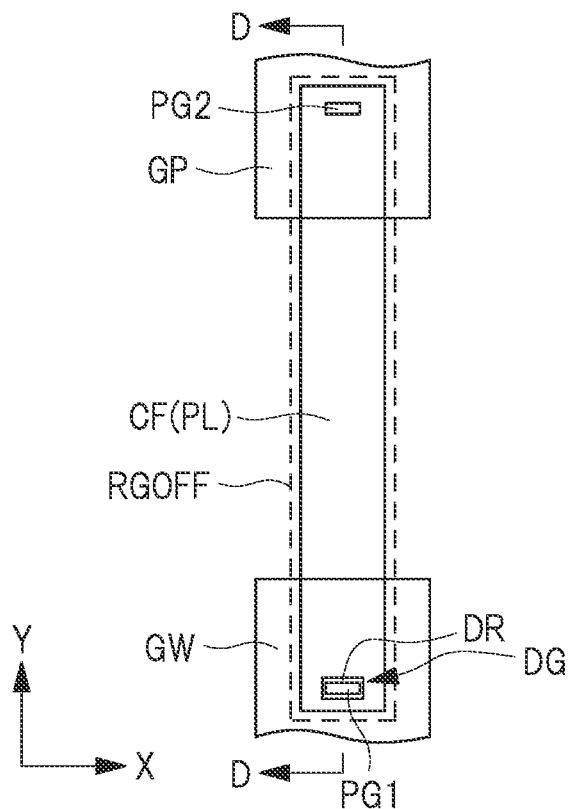
Figure 18:
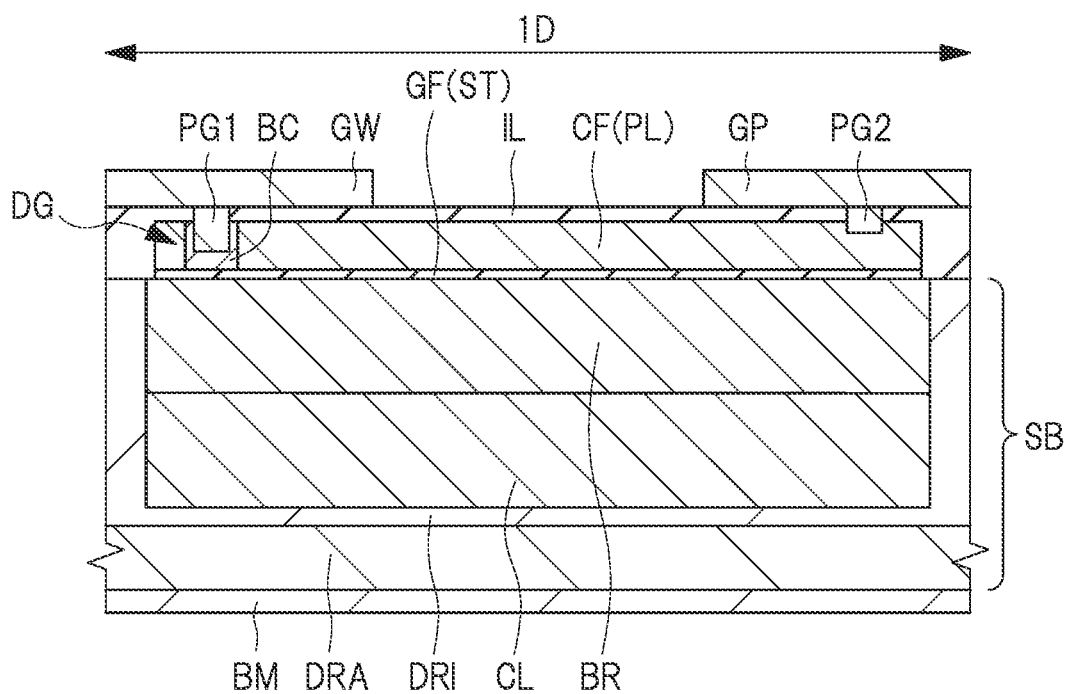
Figure 19:
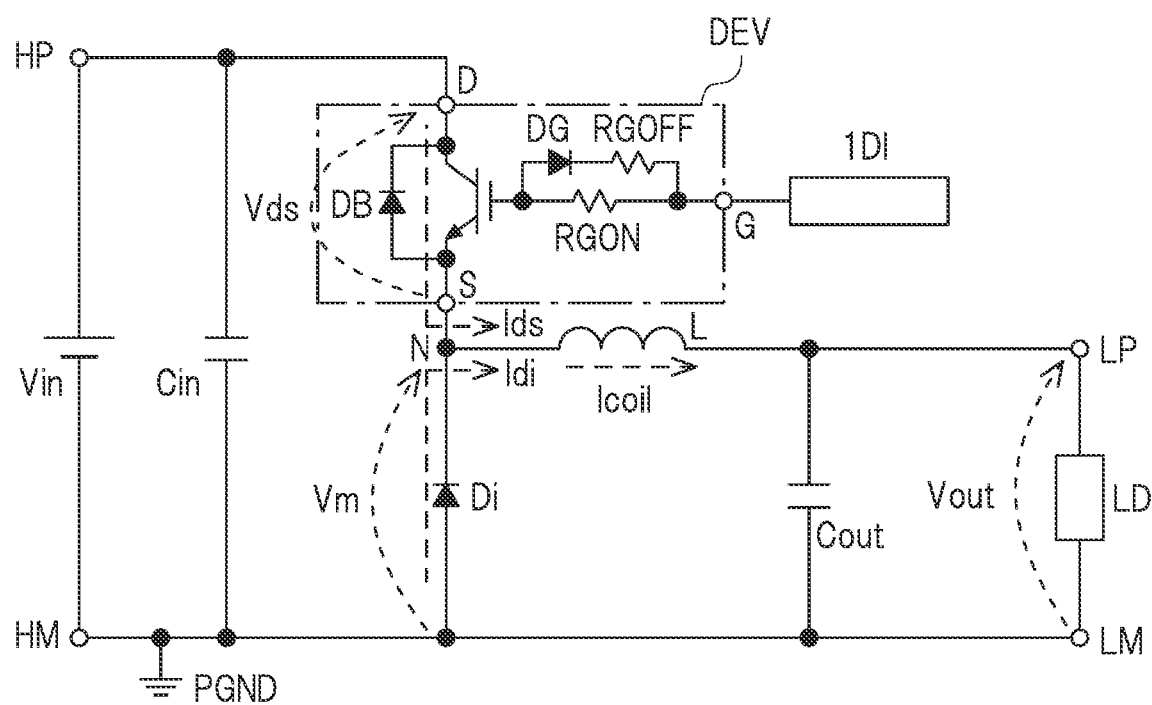
Figure 20:
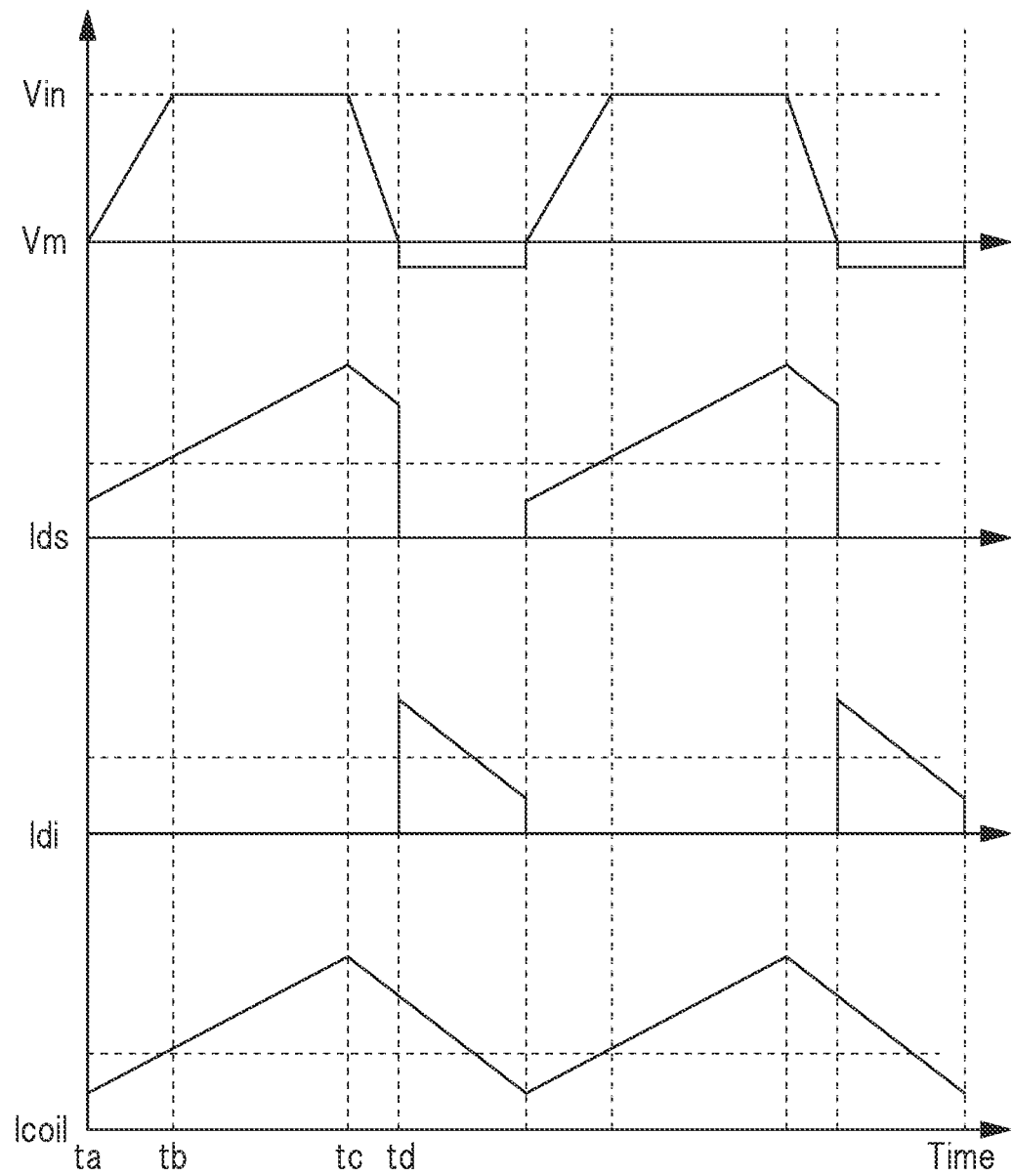

FIG. 1 is a plan view showing a semiconductor device of a first embodiment.
FIG. 2 is a cross-sectional view taken along a line A-A of FIG. 1.
FIG. 3 is an enlarged plan view of a portion of FIG. 1.
FIG. 4 is a cross-sectional view taken along a line B-B of FIG. 3.
FIG. 5 is an enlarged plan view of a portion of FIG. 1.
FIG. 6 is a cross-sectional view taken along a line C-C of FIG. 5.
FIG. 7 is an enlarged plan view of a portion of FIG. 1.
FIG. 8 is a cross-sectional view taken along a line D-D of FIG. 7.
FIG. 9 is a circuit diagram of the semiconductor device of the first embodiment.
FIG. 10 is a cross-sectional view of the semiconductor device of the first embodiment during a manufacturing process.
FIG. 11 is a cross-sectional view of the semiconductor device during the manufacturing process continued from FIG. 10.
FIG. 12 is a cross-sectional view of the semiconductor device during the manufacturing process continued from FIG. 11.
FIG. 13 is a cross-sectional view of the semiconductor device during the manufacturing process continued from FIG. 12.
FIG. 14 is a plan view showing the semiconductor device of a second embodiment.
FIG. 15 is an enlarged plan view of a portion of FIG. 14.
FIG. 16 is a cross-sectional view taken along a line E-E of FIG. 15.
FIG. 17 is an enlarged plan view of a portion of the semiconductor device of a third embodiment.
FIG. 18 is a cross-sectional view taken along a line D-D of FIG. 17.
FIG. 19 is an equivalent circuit diagram of a buck converter of a fourth embodiment.
FIG. 20 is a timing diagram describing an operation of the buck converter of the fourth embodiment.

DETAILED DESCRIPTION

In the embodiments described below, the invention will be described in a plurality of sections or embodiments if necessary for the sake of convenience. However, these sections or embodiments are not irrelevant to each other unless otherwise clearly specified, and one section or embodiment partially or entirely corresponds to another section or embodiment as a modification, detailed or supplementary description or the like. In addition, in the embodiments described below, when referring to the number of a component (including number of pieces, numerical value, amount and range), the number is not limited to a specified number and may be less than or greater than this number unless otherwise clearly specified or unless it is obvious from the context that the number is limited to the specified number in principle.

Furthermore, in the embodiments described below, it goes without saying that each component (including an element step) is not indispensable unless otherwise clearly specified or unless it is obvious from the context that the component is indispensable in principle. Likewise, in the embodiments described below, when referring to a shape, a positional relation or the like of a component, a substantially approximate shape, a similar shape or the like is included unless otherwise clearly specified or unless it is obvious from the context that the shape, the positional relation or the like of the component differs in principle. The same applies to the above-described numerical value and range.

Hereinafter, embodiments of the present invention will be described with reference to the drawings. Note that, in all of the drawings, the same members are denoted by the same reference signs, and redundant descriptions thereof are omitted as appropriate. In addition, in the embodiments described below, descriptions of the same or similar portions are generally not repeated unless otherwise necessary.

In addition, the symbols "−" and "+" denote a relative concentration of impurities whose conductivity type is N type or P type, and, for example, an n type impurity concentration increases in the order of "N−", "N" and "N+". Note that the term "N type" or "P type" can also be used regardless of the concentration.

First Embodiment

<Structure of Semiconductor Device>

Hereinafter, a structure of a semiconductor device of the present embodiment will be described with reference to FIGS. 1 to 8. In FIGS. 1, 3, 5 and 7, an interlayer insulating film on a semiconductor substrate (epitaxial layer) is omitted from the drawings. The semiconductor device of the present embodiment comprises a vertical power MOSFET (Metal Oxide Semiconductor Field Effect Transistor). The MOSFET is a type of MISFET (Metal Insulator Semiconductor Field Effect Transistor).

Here, a case where the semiconductor device comprises the vertical power MOSFET with a superjunction structure will be described. Note that the MOSFET constituting the semiconductor device is not limited to be of a superjunction structure and may be of a vertical MOSFET in which current flows between an upper surface side of the semiconductor substrate and a lower surface side opposite to the upper surface.

As shown in FIG. 1, a shape of the semiconductor device (power device, semiconductor chip) DEV of the present embodiment is rectangular in plan view. The semiconductor device DEV of the present embodiment has a cell region (element region) and a peripheral region. The cell region is arranged in a center portion of the semiconductor device DEV that is rectangular in plan view, and the peripheral region is an annular region surrounding the cell region. In other words, the peripheral region is an outer periphery of the semiconductor device DEV. A source pad (source electrode) SP and a portion of a gate pad GP are formed in the cell region. In addition, another portion of the gate pad GP and a gate wiring GW successively surrounding three of the four sides of the cell region that is rectangular in plan view are formed in the peripheral region. The source pad SP, the gate pad GP and the gate wiring GW are made of a conductor (such as Al (aluminum)) formed at the same height on the semiconductor substrate SB and are arranged so as to be spaced apart from one another.

In plan view, both ends of the gate wiring GW extending so as to surround the cell region terminate in a peripheral region adjacent to one of the four sides of the cell region. A portion of the gate pad GP is positioned between these ends. Here, one of the two ends of the gate wiring GW in an extension direction and the gate pad GP are electrically connected by a resistor (turn-ON gate resistor) RGON formed below both the gate wiring GW and the gate pad GP. In addition, the other of the two ends of the gate wiring GW in the extension direction and the gate pad GP are electrically connected by a resistor (turn-OFF gate resistor) RGOFF and a rectifier diode DG formed below both the gate wiring GW and the gate pad GP.

The rectifier diode DG is encapsulated in the resistor RGOFF between the gate wiring GW and the gate pad GP. A cathode of the rectifier diode DG is electrically connected to the gate pad GP via the resistor RGOFF, and an anode of the rectifier diode DG is electrically connected to the gate wiring GW.

(1) Structure of Cell Region

As shown in FIG. 2, the vertical power MOSFET is formed in a region 1A which is the cell region. FIG. 2 is a cross-sectional view taken along a line A-A of FIG. 1 and shows a cross section of the cell region. Main components of the power MOSFET are formed in the semiconductor substrate SB. The semiconductor substrate SB has a drain region DRA which is an $N^+$ type semiconductor region, and a drift layer DRI which is an $N^-$ type semiconductor region formed on the drain region DRA. The drain region DRA and the drift layer DRI are epitaxial layers (semiconductor layers) formed on a substrate made of, for example, Si (silicon) by an epitaxial growth method. Namely, the semiconductor substrate SB described here is a stacked semiconductor substrate (epitaxial substrate) including a substrate below the drift layer DRI and an epitaxial layer such as the drift layer DRI. A drain electrode BM made of a metal film is formed on and covers a lower surface of the semiconductor substrate SB. In other words, the drain electrode BM is in contact with the lower surface of the semiconductor substrate SB and is electrically connected to the drain region DRA.

A plurality of trenches TR are formed in an upper surface of the drift layer DRI and reach an intermediate depth of the drift layer DRI. The plurality of trenches TR extend in a Y direction shown in FIG. 1 and are aligned in an X direction in the cell region. The X and Y directions in the present application are directions along the upper surface of the semiconductor substrate SB, that is, the upper surface of the drift layer DRI, and are orthogonal to each other in plan view.

As shown in FIG. 2, a conductive film CF is embedded in the trench TR via a gate insulating film GF. In other words, side and bottom surfaces of the trench TR are covered by the gate insulating film GF made of, for example, a silicon oxide film, and the drift layer DRI and the conductive film CF are insulated by the gate insulating film GF. The conductive film CF is made of, for example, an N type polycrystalline silicon film. The conductive film CF in the cell region constitutes a gate electrode (trench gate electrode) GE of the power MOSFET. The gate insulating film GF and the conductive film CF extend along the trench TR in the Y direction. The conductive film CF is preferably made of, for example, Si (silicon).

A P type base region (P type semiconductor region) BR is formed in the drift layer DRI between the trenches TR adjacent to each other in the X direction. A $P^+$ type base contact region BC and a source region SR which is an $N^+$ type diffusion region are formed over a predetermined depth from an upper surface of the base region BR. An impurity concentration of the source region SR is higher than an impurity concentration of the drift layer DRI.

The base region BR is formed between the side surfaces of the trenches TR adjacent to each other in the X direction. In other words, the base region BR is in contact with the side surface of the trench TR. The base region BR extends along the trench TR in the Y direction. A depth of the base region BR, that is, a position of a bottom surface of the base region BR, is shallower than a depth of the trench TR. The base region BR and the trench TR are alternately and repeatedly arranged in the X direction.

The base contact region BC and the source region SR are each formed on the upper surface of the drift layer DRI and extend in the Y direction. The base contact region BC is sandwiched between the two source regions SR between the trenches TR adjacent to each other in the X direction, and the two source regions SR are in contact with the base contact region BC. In addition, the source region SR and the base contact region BC are in contact with the base region BR just below them, and the source region SR is in contact with the trench TR. The base contact region BC is provided for supplying voltage to the base region BR. An impurity concentration of the base contact region BC is higher than an impurity concentration of the base region BR.

A P type column (P type pillar) CL which is a P$^-$ type semiconductor region is formed just below the base region BR. The column CL is formed so as to be in contact with a lower surface of the base region BR and extending in a depth direction from the lower surface to the intermediate depth of the drift layer DRI below the base region BR. The column CL has a relatively high aspect ratio. The trench TR and the column CL are spaced apart from each other in plan view, and the column CL is not formed just below the trench TR. A depth of the column CL (position of a bottom surface) is deeper than the depth of the trench TR. The bottom surface of the column CL may reach an upper surface of the drain region DRA.

In plan view, the plurality of columns CL are arranged so as to be aligned in the X direction. Thus, the column CL and the drift layer DRI are alternately aligned in the X direction. The drift layer DRI which is an N$^-$ type semiconductor layer between the columns CL adjacent to each other can also be referred to as an N type column (N type pillar). Such a structure in which a P type column and an N type epitaxial layer (N type column) are periodically arranged is called a superjunction structure. An impurity concentration of the column CL is lower than the impurity concentration of the base contact region BC.

The gate electrode GE, the source region SR, the base region BR and the drain region DRA constitute the vertical power MOSFET. A portion of the base region BR facing the gate electrode GE via the gate insulating film GF is a channel region in which a channel is formed when the N type power MOSFET is in an ON state.

N type impurities such as P (phosphorus) are introduced into the drain region DRA and the drift layer DRI. P type impurities such as B (boron) are introduced into the column CL, the base region BR and the base contact region BC. N type impurities such as P (phosphorus) or As (arsenic) is introduced into the source region SR. The drain region DRA, the drift layer DRI, the column CL, the base region BR, the base contact region BC and the source region SR constitute the semiconductor substrate SB. In other words, the drain region DRA, the drift layer DRI, the column CL, the base region BR, the base contact region BC and the source region SR are formed in the semiconductor substrate SB. The trench TR, the base region BR, the base contact region BC and the source region SR are formed in the upper surface of the semiconductor substrate SB, and the drain region DRA is formed in the lower surface of the semiconductor substrate SB.

An interlayer insulating film IL made of, for example, a silicon oxide film is formed on the semiconductor substrate SB. The source pad SP is formed on the interlayer insulating film IL in the region 1A which is the cell region. A plurality of connection holes (openings) penetrating through the interlayer insulating film IL are formed just below the source pad SP, and a plug (conductive connection portion) PG1 is formed in the connection hole. A lower end of the plug PG1 is connected to the source region SR and the base contact region BC in the region 1A, and an upper end of the plug PG1 is connected to a lower surface of the source pad SP. In other words, the source pad SP is electrically connected to the source region SR and the base contact region BC via the plug PG1. The base contact region BC is formed just below the plug PG1 and is connected to a lower surface of the plug PG1. The source region SR is in contact with a side surface of the plug PG1 reaching an intermediate depth of the semiconductor substrate SB.

(2) Structure of Peripheral Region

FIG. 3 shows a planar layout in the vicinity of a line B-B shown in FIG. 1 and shows a region from the peripheral region to an end portion of the cell region. FIG. 3 schematically shows a structure just below the gate wiring GW and a structure just below the source pad SP. In addition, FIG. 3 shows the semiconductor substrate SB but does not separately show the plurality of regions such as the source region and the base region formed in the semiconductor substrate SB. In addition, FIG. 4 is a cross-sectional view taken along the line B-B shown in FIG. 3 and shows a cross section of a region 1B including the peripheral region and the cell region.

As shown in FIG. 3, the plurality of conductive films CF aligned in the cell region in the X direction are connected to one another just below the gate wiring GW and are integrated with one another. In other words, the plurality of trenches TR aligned in the cell region in the X direction are connected to one another just below the gate wiring GW.

As shown in FIGS. 3 and 4, the interlayer insulating film IL made of, for example, a silicon oxide film is formed on the semiconductor substrate SB. The gate wiring GW is formed on the interlayer insulating film IL in the peripheral region. The plurality of connection holes (openings) penetrating through the interlayer insulating film IL are formed just below the gate wiring GW, and a plug (conductive connection portion) PG2 is formed in the connection hole. A lower end of the plug PG2 is connected to the upper surface of the conductive film CF in the peripheral region, and an upper end of the plug PG2 is connected to a lower surface of the gate wiring GW. In other words, the gate wiring GW and the conductive film CF (gate electrode GE) are electrically connected via the plug PG2. The plurality of plugs PG1 connected to the source region SR and the base contact region BC are aligned in the cell region in the X direction. The trench TR in the peripheral region is formed in the semiconductor region made of the column CL and the base region BR formed continuously from the cell region to the peripheral region.

FIG. 5 shows a planar layout of the peripheral region in the vicinity of a line C-C shown in FIG. 1. FIG. 5 schematically shows the structure just below the gate wiring GW and a structure just below the gate pad GP. In addition, FIG. 5 shows the semiconductor substrate SB but does not separately show the plurality of regions such as a drift region and the base region formed in the semiconductor substrate SB. FIG. 6 is a cross-sectional view taken along a line C-C shown in FIG. 5 and shows a region 1C which is the peripheral region.

Here, as shown in FIG. 5, the conductive film CF having the same structure as the trench gate electrode in the cell region is used as the resistor RGON connecting an end portion of the gate wiring GW and the gate pad GP. Namely, the resistor RGON is constituted by the conductive film CF formed in the trench TR extending in the Y direction from just below the gate wiring GW to just below the gate pad GP via the gate insulating film GF. Here, two parallel conductive films CF extending in the Y direction are provided. One end portion of one conductive film CF in the Y direction is connected to one end portion of the other conductive film CF just below the gate wiring GW, and the other end portion of one conductive film CF is connected to the other end portion of the other conductive film CF just below the gate pad GP. The number of conductive films CF connecting the end portion of the gate wiring GW and the gate pad GP may be one. In addition, the end portion of the gate wiring GW and the gate pad GP may be connected to each other by the resistor RGON constituted by three or more plurality of conductive films CF connected in parallel.

As shown in FIGS. 5 and 6, the plug PG2 penetrating through the interlayer insulating film IL is formed just below each of the end portion of the gate wiring GW and the gate pad GP. The end portion of the gate wiring GW is electrically connected to the conductive film CF via the plug PG2, and the gate pad GP is electrically connected to the conductive film CF via the plug PG2. The resistor RGON is constituted by the plug PG2 and the conductive film CF connecting the end portion of the gate wiring GW and the gate pad GP. The trench TR in the region 1C is formed in the semiconductor region made of the column CL and the base region BR.

FIG. 7 shows a planar layout of the peripheral region in the vicinity of a line D-D shown in FIG. 1. FIG. 7 schematically shows the structure just below the gate wiring GW and the structure just below the gate pad GP. In addition, FIG. 7 shows the semiconductor substrate SB but does not separately show the plurality of regions such as the drift region and the base region formed in the semiconductor substrate SB. FIG. 8 is a cross-sectional view taken along a line D-D shown in FIG. 7 and shows a region 1D which is the peripheral region.

Here, as shown in FIG. 7, the conductive film CF having the same structure as the trench gate electrode in the cell region is used as the resistor RGOFF connecting the end portion of the gate wiring GW and the gate pad GP. Namely, the resistor RGOFF is mainly constituted by the conductive film CF formed in the trench TR extending in the Y direction from just below gate wiring GW to just below the gate pad GP via the gate insulating film GF. Here, two parallel conductive films CF extending in the Y direction are provided. One end portion of one conductive film CF in the Y direction is connected to one end portion of the other conductive film CF just below the gate wiring GW, and the other end portion of one conductive film CF is connected to the other end portion of the other conductive film CF just below the gate pad GP. The number of conductive films CF connecting the end portion of the gate wiring GW and the gate pad GP may be one. In addition, the end portion of the gate wiring GW and the gate pad GP may be connected to each other by the resistor RGOFF constituted by three or more plurality of conductive films CF connected in parallel.

As shown in FIGS. 7 and 8, the plug PG2 penetrating through the interlayer insulating film IL is formed just below the gate pad GP. In addition, the plug PG1 penetrating through the interlayer insulating film IL is formed just below the end portion of the gate wiring GW. The gate pad GP is electrically connected to the conductive film CF via the plug PG2.

In the region 1D, the rectifier diode DG is formed in the trench TR below the plug PG1 formed just below the gate wiring GW via the gate insulating film GF, unlike the structure shown in FIG. 6. The rectifier diode DG is constituted by a P-N junction between the conductive film CF which is an N type semiconductor region formed in the trench TR and a P type semiconductor region DR formed so as to have a predetermined depth from a surface of the conductive film CF in contact with the plug PG1. The semiconductor region DR is a region formed by forming the connection hole penetrating through the interlayer insulating film IL on the conductive film CF in a thickness direction, and then performing an ion implantation of P type impurities (such as B (boron)) on the upper surface of the conductive film CF by using the interlayer insulating film IL or a photoresist film remaining on the interlayer insulating film IL as an injection blocking mask.

The semiconductor region DR is formed in the conductive film CF in contact with side and lower surfaces of the plug PG1 reaching an intermediate depth of the conductive film CF. A lower surface of the semiconductor region DR does not reach a lower surface of the conductive film CF. The conductive film CF constituting the resistor RGOFF and the plug PG1 are electrically connected via the rectifier diode DG comprising the semiconductor region DR. Namely, the conductive film CF constituting the resistor RGOFF and the end portion of the gate wiring GW are electrically connected via the rectifier diode DG. In other words, in the region 1D, the end portion of the gate wiring GW and the gate pad GP are connected by the resistor RGOFF including the rectifier diode DG. The semiconductor region DR constitutes the anode of the rectifier diode DG, and the conductive film CF in contact with the semiconductor region DR constitutes the cathode of the rectifier diode DG. Thus, the anode of the rectifier diode DG is electrically connected to the gate wiring GW via the plug PG1, and the cathode of the rectifier diode DG is electrically connected to the conductive film CF constituting the resistor RGOFF. The resistor RGOFF is constituted by the plug PG1 connecting the end portion of the gate wiring GW and the gate pad GP, the rectifier diode DG, the conductive film CF and the plug PG2. The trench TR in the region 1D is formed in the semiconductor region made of the column CL and the base region BR.

In the present embodiment, a resistance value of the resistor RGON is larger than a resistance value of the resistor RGOFF. The following structure can be considered as a method of achieving such a difference in resistance values. Namely, a length in the Y direction of the conductive film CF constituting the resistor RGON that connects the gate wiring GW and the gate pad GP in the region 1C shown in FIG. 6 can be made to be longer than a length in the Y direction of the conductive film CF constituting the resistor RGOFF that connects the gate wiring GW and the gate pad GP in the region 1D shown in FIG. 8. In addition, the number of conductive films CF (resistors RGON) connecting in parallel the gate wiring GW and the gate pad GP in the region 1C may be less than the number of conductive films CF (resistors RGOFF) connecting in parallel the gate wiring GW and the gate pad GP in the region 1D. In addition, a width in plan view of the conductive film CF (resistor RGON) connecting the gate wiring GW and the gate pad GP in the region 1C may be smaller than a width in plan view of the conductive film CF (resistor RGOFF) connecting the gate wiring GW and the gate pad GP in the region 1D.

<Effects of Semiconductor Device>

The semiconductor device of the present embodiment is provided with a mixture of resistors RGON and RGOFF, the rectifier diode DG and a power MOSFET Q1 shown in FIG. 9 on the same semiconductor substrate to mainly reduce noise generated by switching of the power MOSFET. The power MOSFET Q1 shown in FIG. 9 corresponds to the power MOSFET in the cell region described with reference to FIGS. 1 and 2.

As shown in FIG. 9, the resistor RGON is connected to the gate electrode GE of the power MOSFET Q1, and the resistor RGOFF including the rectifier diode DG is connected in parallel to the resistor RGON. Here, the anode of the rectifier diode DG is electrically connected to the gate electrode GE of the power MOSFET Q1. In addition, the resistance value of the resistor RGON is larger than the resistance value of the resistor RGOFF. Thus, when the power MOSFET Q1 is turned ON, the resistor RGON functions as the gate resistor, and when the power MOSFET Q1 is turned OFF, the resistor RGOFF functions as the gate resistor.

Although specific principles will be described in the fourth embodiment, connecting the resistor RGON, the resistor RGOFF and the rectifier diode DG to the gate electrode GE of the power MOSFET in such a manner allows a switching speed of the semiconductor device DEV to be controlled. Namely, the semiconductor device of the present embodiment has built-in gate resistors that respectively and suitably function when the power MOSFET is turned ON and OFF. As a result, when turned ON, switching becomes relatively gentle and noise can be reduced, and when turned OFF, switching becomes rapid and efficiency can be improved (or switching loss can be reduced). In addition, the resistor and the diode can be formed in a lower portion of the gate wiring laid out in a relatively wide area, whereby an increase in an area of the semiconductor device can be suppressed, and certain countermeasures for noise can be taken without increasing the cost.

Note that FIGS. 1 and 9 show circuit symbols such that the resistor is connected in series to the rectifier diode. In the present embodiment, a case where the rectifier diode DG is included in the resistor RGOFF has been described. However, a configuration in which the rectifier diode DG and the resistor RGOFF are connected in series can also be considered.

<Manufacturing Method of Semiconductor Device>

Next, a manufacturing method of the semiconductor device of the present embodiment will be described with reference to FIGS. 10 to 13. FIGS. 10 to 13 are cross-sectional views of the semiconductor device of the present embodiment during the manufacturing process. In FIGS. 10 to 13, cross-sectional views of the region 1B described with reference to FIG. 4, the region 1C described with reference to FIG. 6 and the region 1D described with reference to FIG. 8 are shown aligned in this order from left to right. Note that the region 1B described below includes the cell region.

First, as shown in FIG. 10, the semiconductor substrate SB (semiconductor wafer) is prepared. The semiconductor substrate SB is a stacked semiconductor substrate made of the drain region DRA and the drift layer DRI formed by the epitaxial growth method. The drain region DRA is an N$^+$ type semiconductor region, and the drift layer DRI above the drain region DRA is an N$^-$ type semiconductor region. The semiconductor substrate SB has a plurality of chip regions that are later singulated by dicing to form semiconductor chips. In plan view, the cell region in which elements are formed is provided in a center of each chip region. An outer periphery of the cell region in the chip region is the peripheral region. The semiconductor substrate SB is formed by introducing N type impurities such as P (phosphorus) into monocrystalline silicon.

Subsequently, P type impurities (such as B (boron)) are injected into the upper surface of the semiconductor substrate SB in each of the regions 1B, 1C and 1D by using the photolithography technique and the ion implantation method. As a result, the base region BR shallower than the drift layer DRI is formed.

Subsequently, N type impurities (such as As (arsenic) or P (phosphorus)) are injected into the upper surface of the base region BR in the cell region by using the photolithography technique and the ion implantation method. As a result, the N$^+$ type source region SR is formed from the upper surface of the base region BR to an intermediate depth of the base region BR.

Subsequently, P type impurities (such as B (boron)) are injected into the upper surface of the semiconductor substrate SB in the cell region by using the photolithography technique and the ion implantation method. As a result, the plurality of columns CL which are P$^-$ type semiconductor regions are formed just below the base region BR in the cell region. The plurality of columns CL are formed so as to be aligned in the X direction. The columns CL are formed by, for example, multiple ion implantations (multi-stage implantation).

As a result, a superjunction structure in which the columns CL and the N type drift layer DRI are alternately aligned in the X direction is formed.

Subsequently, the plurality of trenches TR are formed in the upper surface of the semiconductor substrate SB in each of the regions 1B, 1C and 1D by using the photolithography technique and the dry etching method. In the cell region, the plurality of trenches TR extend in the Y direction along the upper surface of the semiconductor substrate SB and are aligned in the X direction orthogonal to the Y direction in plan view. Each of the trenches TR reaches the intermediate depth of the semiconductor substrate SB which is a position deeper than the base region BR and shallower than the column CL.

Subsequently, a silicon oxide film covering the side and bottom surfaces of the trench TR and the upper surface of the semiconductor substrate SB outside the trench TR is formed by using, for example, an oxidation method. Subsequently, a silicon film is formed on the silicon oxide film by using, for example, a CVD (Chemical Vapor Deposition) method to completely fill the trench TR. Subsequently, the silicon oxide film and the silicon film on the upper surface of the semiconductor substrate SB except inside the trench TR are removed by, for example, etching back the films. As a result, the conductive film CF made of the silicon film is formed in the trenches TR via the gate insulating film GF made of the silicon oxide film.

The conductive film CF in the region 1B constitutes the gate electrode GE. The conductive film CF in the region 1C and the conductive film CF in the region 1D are spaced apart from each other and extend in the Y direction in plan view. The conductive film CF in the region 1C constitutes the resistor RGON, and the conductive film CF in the region 1D constitutes the resistor RGOFF (see FIGS. 5 and 7). The gate electrode GE, the source region SR, the base region BR and the drain region DRA constitute the vertical power MOSFET.

Subsequently, the interlayer insulating film IL made of, for example, a silicon oxide film is formed on the semiconductor substrate SB and on the conductive film CF by using, for example, the CVD method. As a result, the structure shown in FIG. 10 is obtained.

Next, as shown in FIG. 11, the interlayer insulating film IL is patterned by using the photolithography technique and the dry etching method. As a result, the plurality of connection holes (openings) penetrating through the interlayer insulating film IL are formed. Each of the plurality of connection holes exposes the source region SR and the base region BR in the cell region and exposes the upper surface of one of the two end portions of the conductive film CF extending in the Y direction in the region 1D.

Subsequently, P type impurities (such as B (boron)) are injected into the upper surface of the semiconductor layer exposed by the connection hole, that is, the upper surface of the semiconductor substrate SB in the cell region, and the upper surface of a portion of the conductive film CF in the region 1D by using the ion implantation method. Here, ion implantation is performed by using the interlayer insulating film IL or the photoresist film remaining on the interlayer insulating film IL as an injection blocking mask. As a result, the $P^+$ type base contact region BC is formed in the cell region from the upper surface of the base region BR to the intermediate depth of the base region BR and at a position spaced apart from the trench TR. The base contact region BC extends in the Y direction. In addition, the $P^+$ type semiconductor region DR is formed on the upper surface of one end portion of the conductive film CF in the region 1D in the extension direction. The semiconductor region DR is formed from the upper surface of the conductive film CF to the intermediate depth of the conductive film CF. The semiconductor region DR and the conductive film CF in contact with the semiconductor region DR in the region 1D constitute the rectifier diode DG.

In the above, a case regarding performing an implantation step in which the base contact region BC and the semiconductor region DR are formed and a step for opening the connection hole just above these regions in the same step has been described. However, for reasons such as to improve recovery characteristics of the rectifier diode DG, the connection hole for only the rectifier diode portion may be opened by using a dedicated mask, or a dedicated ion implantation may be performed.

Subsequently, the plug PG1 made of a conductor (such as W (tungsten)) filling the connection hole is formed by using, for example, a sputtering method and a CMP (Chemical Mechanical Polishing) method.

Next, as shown in FIG. 12, the interlayer insulating film IL is patterned by using the photolithography technique and the dry etching method. As a result, the plurality of connection holes (openings) penetrating through the interlayer insulating film IL are formed. Each of the plurality of connection holes exposes the upper surface of the conductive film CF in each of the regions 1B, 1C and 1D. Specifically, in the region 1B, the connection holes are formed at a plurality of locations in the peripheral region. In addition, in the region 1C, the connection holes are formed so as to individually expose the upper surface of each end in the longitudinal direction (Y direction) of the conductive film CF extending in the Y direction. In addition, in the region 1D, the connection holes are formed so as to expose the upper surface of the end portion in the longitudinal direction (Y direction) of the conductive film CF extending in the Y direction which is opposite to the end portion where the rectifier diode DG is formed.

Subsequently, the plug PG2 made of a conductor (such as W (tungsten)) filling the connection hole is formed by using, for example, the sputtering method and the CMP (Chemical Mechanical Polishing) method. Note that the plug PG1 may be formed in the same step as the plug PG2 described with reference to FIG. 12, instead of forming it in the step described with reference to FIG. 11.

Next, as shown in FIG. 13, a metal film is formed on the interlayer insulating film IL. Namely, a stacked film made of, for example, a TiW (tungsten-titanium) film and an Al (aluminum) film above the TiW film is formed by, for example, the sputtering method. Subsequently, the metal film is patterned to form the source pad SP (source electrode), the gate wiring GW for gate extraction and the gate pad GP made of the metal film. The source pad SP in the cell region is electrically connected to the source region SR and the base contact region BC. The gate wiring GW in the peripheral region of the region 1B is electrically connected to the conductive film CF. In the peripheral region of the region 1C, the gate wiring GW is connected to one end portion of the conductive film CF extending in the Y direction via the plug PG2, and the gate pad GP is connected to the other end portion of the conductive film CF extending in the Y direction via the plug PG2. In the peripheral region of the region 1D, the gate wiring GW is connected to the semiconductor region DR on one end portion of the conductive film CF extending in the Y direction via the plug PG1, and the gate pad GP is connected to the other end portion of the conductive film CF extending in the Y direction via the plug PG2.

Subsequently, a passivation film (not shown) or a cover film (not shown) exposing the source pad SP and the gate pad GP are formed on the interlayer insulating film IL as necessary.

Subsequently, the drain electrode BM is formed on a back surface of the semiconductor substrate SB. For example, a metal film is formed by the sputtering method or a vapor deposition method with the back surface side of the semiconductor substrate SB used as the upper surface. As a result, the drain electrode BM made of the metal film can be formed.

Thereafter, each of the plurality of chip regions of the semiconductor wafer are singulated by cutting the semiconductor wafer in a dicing step. In other words, one semiconductor chip is obtained from one chip region, and a plurality of semiconductor chips are obtained from one semiconductor wafer. By the above-described steps, the semiconductor device DEV of the present embodiment which is the semiconductor chip (see FIG. 1) can be formed.

<Effects of Manufacturing Method of Semiconductor Device>

In the manufacturing method of the semiconductor device of the present embodiment, the semiconductor device with built-in gate resistors that respectively and suitably function when the power MOSFET is turned ON and OFF is manufactured, as described in the effects of the semiconductor device. As a result, when turned ON, switching becomes relatively gentle and noise can be reduced, and when turned OFF, switching becomes rapid and efficiency can be improved (or switching loss can be reduced).

In addition, the resistors RGON and RGOFF are formed here by using the conductive film CF in the trench TR, and the rectifier diode DG is formed by reusing the formation step of the base contact region BC, whereby additional steps for forming a resistor and a rectifier diode are unnecessary. In addition, the resistor and the diode can be formed in the lower portion of the gate wiring laid out in a relatively wide area, whereby an increase in an area of the semiconductor device can be suppressed, and certain countermeasures for noise can be taken without increasing the cost.

Second Embodiment

Next, the semiconductor device of the present embodiment will be described with reference to FIGS. 14 to 16. As shown in FIG. 14, the semiconductor device DEV of the present embodiment shares some of the structures of the resistors RGON and RGOFF to further improve area efficiency.

As shown in FIG. 14, the structures of the resistors RGON and RGOFF respectively connected to both ends of the gate pad GP are linearly symmetrical with respect to the gate pad GP in plan view. Therefore, in FIGS. 15 and 16, the structures of the resistors RGON and RGOFF connected to one end portion of the gate pad GP will be described. FIG. 16 is a cross-sectional view taken along a line E-E of FIG. 15 and shows a cross section of a region 1E of the semiconductor device DEV.

As shown in FIGS. 15 and 16, the rectifier diode DG is formed in an intermediate portion of the conductive film CF constituting the resistor RGON and extending in the Y direction, unlike the first embodiment. In other words, the rectifier diode DG is arranged (connected) in the intermediate portion of a current path of the resistor RGON. Here, the conductive film CF between the rectifier diode DG and the gate pad GP constitutes the resistor RGOFF. Namely, a portion of the conductive film CF constitutes both of the resistors RGON and RGOFF.

As in the first embodiment, the resistor RGON refers to the resistor from the gate pad GP to the gate wiring GW and is constituted by the conductive film CF and the plug PG2 connecting the gate pad GP and the gate wiring GW. When the power MOSFET is turned ON and current flows through the entire resistor RGON, a direction of the current is from the gate pad GP toward the gate wiring GW. The direction of this current is opposite to that of the rectifier diode DG, whereby no current flows through the rectifier diode DG in this path.

On the other hand, the resistor RGOFF refers to the resistor from the gate pad GP to the gate wiring GW via the rectifier diode DG and the plug PG1. In other words, the resistor RGOFF is constituted by the plug PG2 connected to the gate pad GP, the plug PG1 connected to the gate wiring GW, the rectifier diode DG connected to the plug PG1, and the conductive film CF connected thereto. When the power MOSFET is turned OFF and current flows through the resistor RGOFF, the current flows in the direction from the gate wiring GW toward the gate pad GP. Thus, the direction of the current is forward with respect to that of the rectifier diode DG. Therefore, when the power MOSFET is turned OFF, the current flows through the path including the rectifier diode DG and the resistor RGOFF and not through the entire resistor RGON. As in the first embodiment, each of the resistors RGON and RGOFF is constituted by one conductive film CF or a plurality of conductive films CF arranged in parallel.

The present embodiment can achieve similar effects as those in the first embodiment. In addition, as shown in FIG. 14, the present embodiment has a configuration that is completed with a single region between the gate pad GP and the gate wiring GW, whereby the resistor RGON and the resistor RGOFF can be arranged between the gate pad GP and each of the gate wirings GW sandwiching the gate pad GP. Thus, there is no need to route the gate wiring GW to the end of the chip on the opposite side of the gate pad GP. Therefore, the size of the cell region (MOSFET region) occupied by the chip can be increased.

Third Embodiment

Hereinafter, the semiconductor device of the present embodiment will be described with reference to FIGS. 17 and 18. In the present embodiment, in a case where the conductive film (such as a polysilicon film) is formed on the semiconductor substrate SB, the conductive film CF in the trench TR is not used for mounting the gate resistor, but the conductive film CF on the semiconductor substrate SB is reused for the gate resistor. As shown in FIGS. 17 and 18, no trench is formed here in the upper surface of the semiconductor substrate SB in the region 1D.

One possible manufacturing method of the semiconductor device includes the steps of forming the conductive film CF that is formed on the semiconductor substrate outside the trench TR when the gate electrode GE is formed, and the gate insulating film GF that is formed before the conductive film CF, and using the conductive film CF as the gate resistor. In other words, the conductive film CF is formed on the trench TR and on the gate electrode GE in the trench TR. Another possible manufacturing method of the semiconductor device includes the steps of separately forming a dedicated insulating film ST that differs from the gate insulating film GF and a conductive film PL (such as a polysilicon film) that differs from the gate electrode, such as in a step of incorporating a temperature sensing diode, then patterning the stacked film made of the insulating film ST and the conductive film PL, and using the conductive film PL as the gate resistor. In other words, the conductive film PL and the insulating film ST are formed on the trenches TR and the gate electrode GE in each of the trenches TR. The insulating film ST may also serve as a stopper film for patterning.

As in the first embodiment, the rectifier diode DG can be formed at the same time as the formation step for the base contact region. However, it may be configured such that the semiconductor region DR is formed by a dedicated mask and the ion implantation step to form the rectifier diode DG. FIGS. 17 and 18 show the resistor RGOFF. However, the structure of the gate resistor of the present embodiment can be applied with respect to the resistor RGON (see FIG. 6). In addition, the present embodiment can be applied to the second embodiment.

Fourth Embodiment

The semiconductor device described in the first to third embodiments can be applied to a circuit and the like described below with reference to FIG. 19. FIG. 20 shows an operation timing, an intermediate node N, and currents Ids, Idi and Icoil flowing through each of the devices.

The circuit of the present embodiment shown in FIG. 19 is a general buck converter (non-isolated step-down switching DC/DC convertor). In the present circuit, a step-down output voltage Vout is generated from an input voltage Vin by using the semiconductor device DEV, a flyback diode Di, an inductor (coil) L, an input capacitor Cin, and an output capacitor Cout. One end of the input voltage Vin (node HM) and one end of the output voltage Vout (node LM) are connected to a common power ground PGND.

In addition, in the present circuit, the semiconductor device DEV to which the embodiment of the present invention is applied is arranged on a high side, and the flyback diode Di is arranged on a low side. It is needless to say that the semiconductor device DEV may also be arranged on the low side to perform synchronous rectification. The semiconductor device DEV has a drain terminal D, a source terminal S and a gate terminal G respectively connected to a high potential side (node HP) of the input voltage Vin, the intermediate node N and a driver IC 1DI. One end of the inductor L is further connected to the connected to the intermediate node N which is a connection point between the high side and the low side, and the other end of the inductor L is connected to the high potential side (node LP) of the output voltage Vout. A feedback circuit (not shown) controls the driver IC 1DI such that the output voltage Vout becomes a predetermined voltage and changes an ON/OFF duty ration of the semiconductor device DEV. A voltage of the intermediate node N is an intermediate node voltage Vm.

When the semiconductor device (power device) DEV is turned ON with the input voltage Vin applied, the current Ids flows through the semiconductor device DEV and reaches the intermediate node N. Here, a direction of the flyback diode Di between the intermediate node N and the power ground PGND is in a reverse direction, whereby the current Ids does not flow through the flyback diode Di but flows through the inductor (coil) L. As a result, the voltage between mutual nodes LM and LP at both ends of a load LD rises to a desired output voltage Vout. In this manner, when the voltage applied to the load LD rises to the desired output voltage Vout, the semiconductor device DEV is controlled to be turned OFF. When the semiconductor device DEV is turned OFF, the current Idi through which the load LD flowed flows through the flyback diode Di, the intermediate node N and the inductor L in this order and to the load LD, and continues to flow through such a path, thereby creating a reflux loop of the current Idi.

As the current Idi of this reflux loop continues to flow through the load LD, the voltage of the load LD gradually decreases. The semiconductor device DEV is controlled to be turned ON when the voltage decreases to a predetermined value. When the semiconductor device DEV is turned ON, the current Ids flows again, and the voltage between the nodes LM and LP at both ends of the load LD rises to the desired output voltage Vout. The buck converter maintains generation of the desired output voltage Vout by repeating such ON and OFF operations of the semiconductor device DEV.

In the buck converter, the semiconductor device DEV repeats the above-described ON and OFF operations in very short intervals, whereby it is important to reduce the switching loss and switching noise in the semiconductor device DEV.

Next, an operation of the above-described circuit will be described with reference to FIG. 20. In the horizontal axis of FIG. 20, time ta to tb represents a turn-ON time of the semiconductor device DEV, and time tc to td represents a turn-OFF time of the semiconductor device DEV. In a region where a switching frequency is high, losses in the semiconductor device DEV are mainly losses (switching loss) at a switching time (turn-ON time and turn-OFF time), and a product of the drain-source current Ids and a drain-source voltage Vds flowing through semiconductor device DEV is expressed as a total amount of the switching time.

During the turn-ON time, the current Ids is relatively small, making the switching loss small. Therefore, noise can be reduced by increasing the resistor RGON to extend the turn-ON time and making a voltage change of the intermediate node voltage Vm more gradual.

On the other hand, during the turn-OFF time, the current Ids is relatively large, making the switching loss large. Therefore, the switching loss can be reduced by reducing the resistor RGOFF to shorten the turn-OFF time.

Note that the time tb to tc is the time when the semiconductor device DEV is completely ON, and since the drain-source voltage Vds is close to zero, the loss (conduction loss) during this period can be considered to be sufficiently small.

In the foregoing, the invention made by the inventors of the present invention has been concretely described based on the embodiments. However, it is needless to say that the present invention is not limited to the foregoing embodiments and various modifications and alterations can be made within the scope of the present invention.

In addition, in the above-described embodiments, the semiconductor device comprising a substrate made of Si (silicon) and an epitaxial layer has been described. However, the semiconductor device may be made of SiC (silicon carbide) instead of Si. Namely, the semiconductor substrate, the P type column and the epitaxial layer may be made of SiC.

In addition, in the above-described embodiments, a case where an N-channel type MOSFET is formed has been described. However, the MOSFET may be of a P-channel type. In a case where the P-channel type MOSFET is formed, each of the semiconductor regions constituting the above-described semiconductor device would be formed with the opposite conductivity type.

What is claimed is:
1. A semiconductor device comprising:
a field-effect transistor that includes:
  a gate electrode embedded in a first trench formed in an upper surface of a semiconductor substrate and having a first conductivity type;
  a source region formed in the semiconductor substrate and having the first conductivity type; and
  a drain region formed on a lower surface of the semiconductor substrate and having the first conductivity type;
a source pad formed on the semiconductor substrate and being electrically connected to the source region;
a gate wiring formed on the semiconductor substrate and being electrically connected to the gate electrode;
a gate pad formed on the semiconductor substrate and being electrically connected to the gate electrode via the gate wiring;
a first resistor connected between the gate pad and the gate wiring and being configured to function when the field-effect transistor is turned ON;
a second resistor connected between the gate pad and the gate wiring and being configured to function when the field-effect transistor is turned OFF; and
a rectifier diode included in the first resistor or the second resistor between the gate pad and the gate wiring,
wherein the gate pad, the source pad, and the gate wiring that are formed at a same height on the semiconductor substrate.
2. The semiconductor device according to claim 1,
wherein the first resistor has a larger resistance value than the second resistor, and
the second resistor encapsulates the rectifier diode.
3. The semiconductor device according to claim 2,
wherein the gate electrode and a portion of each of the first resistor and second resistor extend in a first direction along the upper surface of the semiconductor substrate.

4. The semiconductor device according to claim 2, further comprising a second trench and a third trench formed in the upper surface of the semiconductor substrate, wherein the first resistor is constituted by a first conductive film embedded in the second trench and having the first conductivity type, the second resistor is constituted by the rectifier diode and a second conductive film embedded in the third trench and having the first conductivity type, and the rectifier diode arranged at one end portion of the second resistor in an extension direction is constituted by:

the second conductive film; and a semiconductor region having a second conductivity type that differs from the first conductivity type and being formed in the second conductive film.

5. The semiconductor device according to claim 2, wherein the second resistor is constituted by the rectifier diode and a third conductive film formed on the gate electrode and on the semiconductor substrate and having the first conductivity type, and the rectifier diode arranged at one end portion of the second resistor in an extension direction is constituted by:

the third conductive film; and a semiconductor region having a second conductivity type that differs from the first conductivity type and being formed on the third conductive film.

6. The semiconductor device according to claim 2, wherein the rectifier diode is arranged in an intermediate portion of a current path of the first resistor such that a portion of the first resistor functions as the second resistor.

* * * * *